(12) United States Patent
Clark

(10) Patent No.: US 6,297,492 B1
(45) Date of Patent: *Oct. 2, 2001

(54) FAST BICMOS ACTIVE-PIXEL SENSOR CELL WITH FAST NPN EMITTER-FOLLOWER READOUT

(75) Inventor: Lawrence T. Clark, Phoenix, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/003,477

(22) Filed: Jan. 6, 1998

(51) Int. Cl.[7] .................................................. H01J 40/14
(52) U.S. Cl. ............................ 250/214 R; 250/208.1; 257/292
(58) Field of Search .......................... 250/214 R, 208.1, 250/214.1; 377/60; 257/292, 293; 348/301–304

(56) References Cited

U.S. PATENT DOCUMENTS

| | | | |
|---|---|---|---|
| 4,274,113 | * 6/1981 | Ohba et al. | 348/300 |
| 5,283,428 | * 2/1994 | Morishita et al. | 250/214.1 |
| 5,471,515 | * 11/1995 | Fossum et al. | 377/60 |
| 5,541,402 | 7/1996 | Ackland et al. | 250/208.1 |
| 5,552,832 | 9/1996 | Astle | 348/420 |
| 5,602,585 | 2/1997 | Dickinson et al. | 348/155 |
| 5,614,744 | 3/1997 | Merrill | 257/291 |
| 5,869,857 | * 2/1999 | Chen | 257/292 |
| 5,933,188 | * 8/1999 | Shinohara et al. | 348/302 |

* cited by examiner

Primary Examiner—Que T. Le
Assistant Examiner—Thanh X. Luu
(74) Attorney, Agent, or Firm—Blakely, Sokoloff, Taylor & Zafman LLP

(57) ABSTRACT

A read out circuit is provided. The read out circuit includes an emitter follower circuit (EFC) that receives information indicative of an intensity of light detected by a pixel of an active pixel sensor array. The EFC drives a value related to the information to a read out device when the pixel is accessed.

26 Claims, 3 Drawing Sheets

FAST BICMOS ACTIVE-PIXEL SENSOR CELL WITH FAST NPN EMITTER-FOLLOWER READOUT

BACKGROUND OF THE INVENTION

(1) Field of the Invention

The present invention relates to imaging devices. In particular, the present invention relates to devices that detect and provide a measure of an intensity of light impinging on imaging pixels in an array.

(2) Background Information

Imaging arrays are frequently used to produce an image representing an object. The imaging arrays typically include rows and columns (bitlines) of photo detectors (pixels). Imaging arrays may also be uni-dimensional, including one row of photo detectors. Such imaging arrays are used in document scanners. The photo detectors generate photo charges proportional to light reflected from an object to be imaged. Photo charges from each pixel are converted to a signal (charge signal) or potential representative of a level of energy reflected from a respective portion of the object. The signal or potential is read and processed by video processing circuitry to create an image representing an object.

Pixels belongings to a same bitline are usually connected at a common output node from where a signal or potential, representative of the level of energy, is read out. Pixels belonging to the same bitline "see" an overall capacitance (hereinafter referred to as "bitline capacitance"), at the common output node. Each pixel in a same bitline is individually controlled to read out at the common output node. Typically, pixels belonging to a same row are commonly controlled by a same signal such that an entire row may be read out at a substantially same time.

Improvement in the speed at which rows of pixels are read out, without substantially negatively affecting bitline swing, constitutes a constant challenge for circuit designers. To reduce overall cost in image sensor devices, it has become desirable and possible to integrate image sensor arrays with digital circuitry that controls the operation of the array and processes the array's output. Integration of an image sensor with complementary-metal-oxide-semiconductor (CMOS) support circuitry is most desirable because of the low power consumption characteristics and common availability of CMOS technology. Such an imaging array integrated with CMOS support circuitry is called CMOS active pixel sensor (APS) array.

Typically, a pixel cell includes a driving device that receives an electronic signal indicative of an intensity of light detected by the image sensor and drives a current proportional to the measure of intensity, to a bitline to which the pixel cell is coupled. Following signal integration, pixels of a selected row are accessed by asserting a WORDLINE signal to each pixel access device of each pixel cell of the selected row. Then the bitlines, to which the pixel cells of a same selected row are coupled, may be charged by a current driven by a driver device of the pixel cells of the selected row, to a voltage level $V_{out}$ representative of an intensity of light detected by the pixel cells of the selected row. The pixels of an entire row may thus be read out at a substantially same time. The pixel cells of other rows, not currently accessed, have their pixel access devices switched off by a deasserted WORDLINE signal corresponding to these rows.

The CMOS support circuitry of the CMOS active pixel sensor array introduces a relatively high capacitance (source-drain) to the bitline that is charged at read out time. This capacitance slows down the read out process. Moreover, MOS transistors display the "body effect" according to which the threshold voltage $V_{TH}$ raises with a raise in the voltage difference ($V_{SB}$) between the bulk and the source. This is reflected in the formula $V_{TH}=V_{TO}+\Gamma(\sqrt{|-2\Phi+sc\ F+V+scSB|}-\sqrt{2|\Phi+sc\ F|})$. According to this formula, when $V_{SB} \neq 0$, $V_{TH}$ increases with $V_{SB}$. In this formula, $V_{TO}$ is the threshold voltage when $V_{SB}=0$, parameter $\Gamma$ (gamma) is termed the body effect coefficient or body factor, and the function $|_F$ is termed equilibrium electrostatic potential in the semiconductor of the transistor. Since $V_{TH}$ raises with $V_{SB}$ and $V_{SB}$ is proportional to $V_{out}$, $V_{TH}$ raises with $V_{out}$, where $V_{out}$ is the voltage read out. For a MOS transistor $V_{out}=V_{in}-V_{TH}$, where $V_{in}$ is the voltage applied to a gate of the MOS transistor. Thus when a MOS transistor is placed at the output of a read out circuit, as in a CMOS source-follower circuit typically used in CMOS active pixel sensor arrays, the voltage read out $V_{out}$ does not depend linearly with $V_{in}$. Also, the output range of the read out circuit is decreased by the variation of $V_{TH}$ with $V_{out}$, such variation causing degradation of the output's dynamic range.

It is desirable to minimize the capacitance "seen" at the output of the read out circuit. It is also desirable to provide an apparatus and method for reading out a CMOS active pixel sensor array with improved read out speed and no degradation of the output's dynamic range.

SUMMARY OF THE INVENTION

The present invention provides a read out circuit. The read out circuit includes an emitter follower circuit (EFC) that receives information indicative of an intensity of light detected by a pixel of an active pixel sensor array. The EFC drives a value, related to the information, to a read out device when the pixel is accessed.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

The present invention provides a read out circuit that may be used in connection with an active pixel sensor array. The read out circuit of the present invention provides improved read out speed and output dynamic range. The read out circuit includes an emitter follower circuit (EFC), coupled to a pixel of an active pixel sensor array. The EFC receives from the pixel information indicative of an intensity of light detected by that pixel. Such information may be an electrical signal generated by the pixel in response to light detected thereby. The EFC drives a value related to the information to a read out device when the pixel is accessed.

The EFC of the read out circuit provides certain advantages to the read out circuit. The advantages include a drive higher than the drive of a MOS transistor, a lower capacitance, and elimination of the body effect. The higher drive and the low capacitance of the EFC cause improvement in the read out speed. The bipolar transistor's junction capacitance (the emitter capacitance) is lower than the source drain capacitance of a MOS transistor. Furthermore, the output range provided by the read out circuit, with the emitter follower circuit, is improved as the body effect of an otherwise MOS transistor is circumvented by the bipolar transistor, of the emitter follower circuit, which does not exhibit the body effect. The output range of the read out circuit is increased as $V_{out}=V_{in}-V_{BE}$, where $V_{BE}$ is the emitter-base voltage of the bipolar transistor. $V_{BE}$ is a fixed value and does not vary with $V_{out}$ as in the case of MOS transistors.

Figure 1:
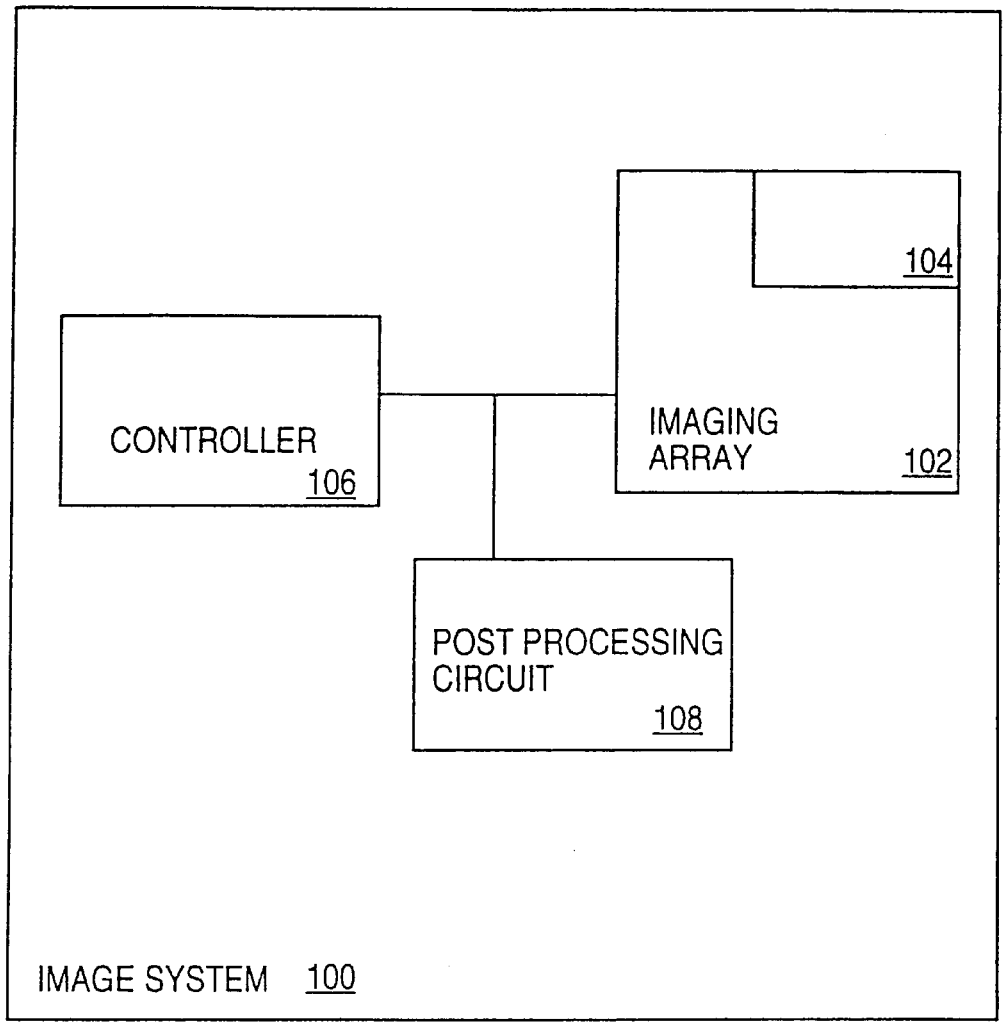
FIG. 1 illustrates an imaging system with a CMOS active pixel sensor array with active pixels and read out circuits.

The present invention may be utilized in connection with various imaging applications. One such example, may be an imaging system, such as a digital camera or a video system. FIG. 1 illustrates an imaging system 100 that may be a digital camera, a video system, or other such imaging systems. The imaging system 100 includes a CMOS active pixel sensor array (hereinafter referred to as "imaging array") 102 that includes a plurality of active pixel cells and read out circuits 104 according to the present invention. The imaging device 100 also includes controller device 106 that controls, inter alia, the active pixel cells and the read out circuits 104 according to the present invention. A post processing circuit 108 is coupled to the controller device and to the imaging array. Such post processing circuit may include an analog-to-digital converter that converts a read out analog signal to a digital signal.

Figure 2:
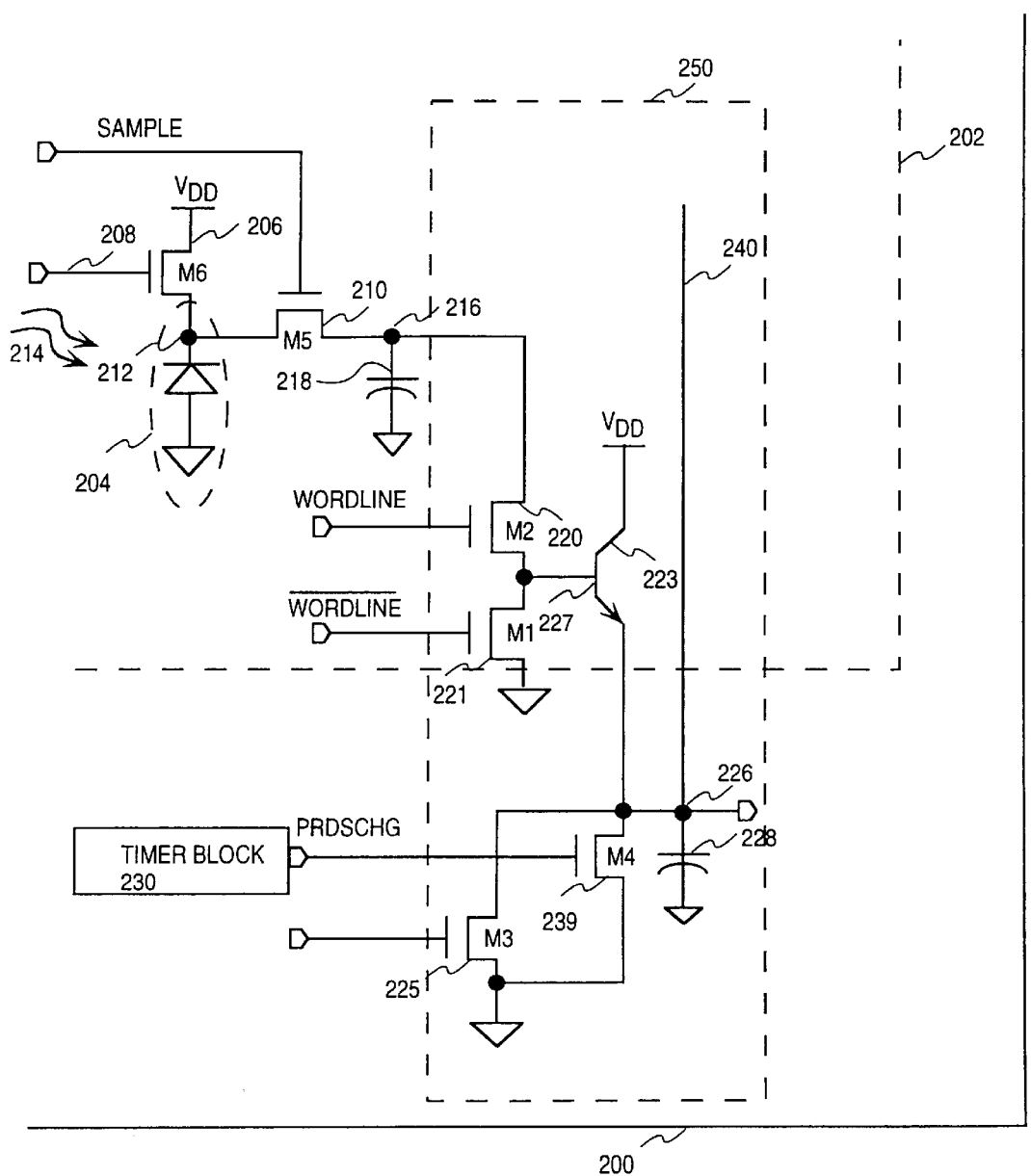
FIG. 2 illustrates an embodiment of a read out circuit with an emitter follower circuit according to the present invention.

FIG. 2 illustrates an embodiment of a read out circuit 250 in connection with active pixel sensor cell (hereinafter "pixel cell") 202 according to the present invention. Pixel cell 202 may be a pixel cell of an active pixel CMOS sensor array belonging to an imaging system 200. Pixel cell 202 includes a photo diode 204 onto which light 214 is impinging. The photodiode is formed in a substrate by any of the various ways well known in the art. Read out circuit 250 and pixel 202 include common elements 220, 221, and 223 that are explained later in this discussion. Pixel cell 202 further includes a reset transistor 206 coupled to a reset line 208 and a transfer gate 210, coupled to a cathode of photo diode 204 (at node 212 and to a sampling capacitor device 218. In one embodiment according to the present invention, reset device 206 and transfer gate 210 may be implemented as NMOS transistors. Reset transistor 206 has a drain thereof coupled to Vdd, a gate thereof coupled to a RESET signal, driven via line 208, and a source thereof coupled to node 212. Transfer gate 210 has a gate thereof coupled to a SAMPLE signal, a drain thereof coupled to node 212, and a source thereof coupled to sampling capacitor 218.

Read out circuit 250 includes a pixel access device 220 coupled to sampling capacitor 218 via node 216. The read out circuit further includes an emitter follower circuit (EFC) made up of a bipolar junction transistor (BJT) 223 and load device 225. Transistor 223 is coupled at a base thereof to the pixel access device 220 which is a NPN transistor in the embodiment described herein. In one embodiment according to the present invention, the pixel access device 220 includes a NMOS transistor that has a drain thereof coupled to node 216, a source thereof coupled to base 227 of transistor 223 and a gate thereof coupled to a WORDLINE signal. Typically, the WORDLINE signal is commonly coupled to each individual pixel cell of an entire row of pixel cells of an active pixel sensor array such as the array shown in FIG. 2. Moreover, the read out circuit includes a device 221 that short circuits the base of transistor 223 to ground thereby causing transistor 223 to be cut off when pixel cell 202 is not selected (i.e., when the WORDLINE signal for pixel cell 202 is deasserted). Elements 239, 225, 228 are placed outside the pixel 202 and are shared by the pixel cells, of the array, that are coupled to bitline 240.

When the WORDLINE signal is asserted to the gate of transistor 220, base 227 of transistor 223 is driven to approximately the sampled value on capacitor 218. The voltage at the base 227 is slightly lower than the voltage on capacitor 218 due to the additional capacitance added by transistor 220, when this transistor is ON, and to the base diffusion of transistor 223. Assuming that capacitor 218 has a capacitance $C_S$, a charge stored on this capacitor is shared between read out device (capacitor) 228, the source-drain capacitance of transistor 220, and the base diffusion capacitance of transistor 223 when the WORDLINE signal is asserted. A sum of these capacitances is $\Delta_C$. Assuming that the voltage on capacitor 218 is initially $V=Q/C_S$, since the overall capacitance is increased by $A_C$, the voltage at the base 227, which is approximately $$V = \frac{Q}{C_s + \Delta c}$$

is lower than the voltage on capacitor 218. The emitter of transistor 223, i.e., the bitline 240, is driven in short time to approximately the sampled value on capacitor 218 minus the forward-biased base-emitter junction $V_{BE}$ of transistor 223.

When the WORDLINE signal is asserted the corresponding $\overline{\text{WORDLINE}}$ signal is deasserted and transistor 221 is in cutoff. In the embodiment of the present invention described herein, when the WORDLINE signal is asserted, for a presently accessed (selected) row, the other WORDLINE signals for the non-selected rows are deasserted. The corresponding $\overline{\text{WORDLINE}}$ signals for the non-selected rows are asserted. When such $\overline{\text{WORDLINE}}$ signal is asserted to a non-selected pixel, transistor 221 of such pixel drives base 227 of transistor 223 of such pixel to ground thereby causing transistor 223 to operate in cut off. This mechanism prevents the existence of a floating node at the base of transistor 223. Such floating node otherwise may impair the circuit operation by allowing de-selected BJT's to turn on due to noise or coupling.

Emitter following transistor (NPN) 223 and NMOS transistor 225 operate based according to principles well known in the art. The emitter of transistor 223 follows the voltage at the base 227 less $V_{BE}$. The read out circuit 250, including the emitter follower circuit described herein, is faster as the base-emitter capacitance of transistor 223 is lower than a source-drain capacitance of a source follower read out type of circuits. In such way the bit line has less load as the output uses an emitter capacitance instead of a drain-source capacitance presented by rows which are not presently being accessed.

Another advantage of the read out circuit according to the present invention, utilizing the emitter follower circuit including transistors 223 and 225, is that the current drive of Bipolar Junction Transistor (BJT) 223, is higher than the drive of a MOS transistor present in source-follower read out types of circuits, causing faster charging of read out capacitor 228 and therefore faster read out. Transistor 239 is used to predischarge bitline 240 before pixel cell 202 is read out.

The read out circuit 250 further includes a predischarge transistor 239 coupled to output node 226. The predischarge transistor 239 is configured to reset the read out device 228 prior to access to the pixel i.e., prior to assertion of the WORDLINE signal to transistor 220. Transistor 239 is used to predischarge capacitor 228 to 0V before this capacitor is read out to indicate a measure of an intensity of the light detected by pixel 202. A circuit 230 that biases transistor 239 keeps track of instances when capacitor 228 may be predischarged. Typically, these instances occur after the WORDLINE signal has been deasserted, to prepare bitline capacitor 212 for reading out a new pixel, coupled to the same bitline, of a newly selected row of the array. Load transistor 225 may be biased by a bias circuit (not shown) that may be implemented by way of current mirrors, the implementation of such type of bias circuits being well known to persons skilled in the art.

There are situations where a previously accessed pixel cell, of a bitline, is exposed to light at an intensity that translates into a voltage or electrical charge higher than the voltage or electrical charge generated by a (new) presently selected pixel of the same bitline. In these situations the embodiment of the read out circuit with the predischarge circuit 239 of the present invention provides a fast discharge of bitline capacitor 228 prior to the read out of the presently selected pixel. The predischarge transistor 239, of the embodiment of the present invention described herein, is designed to be stronger in drive than the load device implemented by transistor 225, thereby providing a faster discharge of bitline capacitor 212 than in situations where predischarge transistor 216 was absent. Transistor 239 is thus larger in size than transistor 225 with a channel wider than a channel of transistor 225. As a result, an impedance of transistor 239 is substantially smaller than an impedance of transistor 225. The drive of device 223 is greater than a drive of device 225 to provide greater voltage range on capacitor 228 during read out.

In an another embodiment of the present invention, instead of utilizing transistor 239 to predischarge capacitor 228, transistor 225 may be controllably biased to have a substantially higher drive, when capacitor 228 is predischarged via transistor 225, than when transistor 225 acts as a load of the emitter follower circuit i.e., when capacitor 228 is charged. In this embodiment the predischarge is performed by modulating the gate voltage of transistor 225, with high voltage for discharge (of the bitline capacitor) and low, but non-zero, voltage for read out (capacitor 228 is charged).

Figure 3:
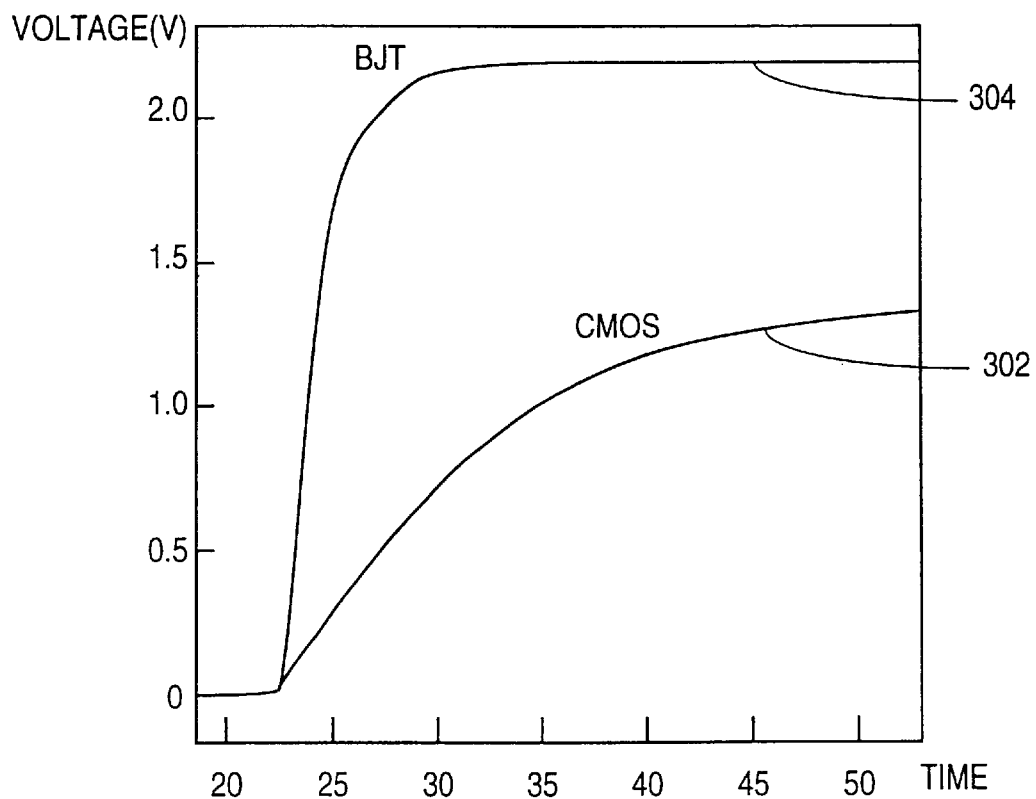
FIG. 3 illustrates a comparative waveform diagram in connection with the embodiment of the read out circuit of the present invention.

FIG. 3 illustrates a first comparative waveform diagram of voltages on a of a bitline for a case where the readout circuit includes a CMOS source follower circuit and a case where the read out circuit includes an emitter-follower circuit as described above. Both readout circuits have similar loading (pixels/line) and are exposed to similar temperatures. Wave form 302 describes a read out voltage on capacitor 228 of FIG. 2 when this capacitor is charged from a predischarged state to the read out state. Waveform 304 describes the voltage on capacitor 228 of FIG. 2, when this capacitor is charged from a predischarge state to read out state. Note that capacitor 228 for a BJT transistor 223, is charged much faster and therefore the readout is faster.

In the foregoing specification, the invention has been described with reference to specific embodiments thereof. It will however be evident that various modifications and changes can be made thereto without departing from the broader spirit and scope of the invention as set forth in the appended claims. For example, a PNP transistor may be used with all of the accompanying circuit polarities reversed, i.e., PMOS transistors instead of NMOS for the read out, load, etc. Other implementations also exist with transistor 210 and capacitor 218 being optional. The specification and drawings are, accordingly, to be regarded in an illustrative rather than a restrictive sense. Therefore, the scope of the invention should be limited only by the appended claims.

What is claimed is:

1. A read out circuit comprising:
    an emitter follower circuit (EFC) to receive information indicative of an intensity of light detected by a pixel of an active pixel sensor array and to drive a value related to said information to a read out device when said pixel is accessed;
    a first signal asserted to a pixel access device;
    a second device to cut off said EFC when a second signal is asserted to said second device; and
    the second signal is 180° degrees in opposition of phase in relation to said first signal.

2. The read out circuit of claim 1, wherein the pixel access device is coupled to said pixel and to said EFC to pass said information from said pixel to said EFC when said pixel is accessed.

3. The circuit of claim 1, wherein the second device is adapted to cut off the EFC when said pixel is not accessed.

4. The circuit of claim 1, further including a reset circuit coupled to the read out device, the reset circuit is adapted to reset said read out device prior to access to said pixel.

5. The circuit of claim 1, said read out device is a capacitive device.

6. The circuit of claim 5, further comprising:
    a circuit to reset said read out device which includes a third device to discharge said capacitive device and a control circuit to permit said third device to discharge said capacitive device prior to access to said pixel.

7. The read out circuit of claim 1, said second signal derived from said first signal.

8. A read out circuit comprising:
    a row switch device (RSD) to receive, from a pixel of a row of an active pixel sensor array, information indicative of an intensity of light detected by said pixel;
    emitter follower circuit (EFC), coupled to said RSD, said RSD configured to drive said information to said EFC, said EFC configured to drive a value related to said information to a read out device when said row of pixels is accessed;
    a first signal asserted to a pixel access device; and
    a second device to cut off said EFC when a second signal is asserted to said second device, the second signal is 180° degrees in opposition of phase in relation to said first signal.

9. In an active pixel sensor array a read out circuit comprising:
    a row switch device (RSD) to receive from one pixel of a row of pixels of said active pixel sensor array information indicative of an intensity of light detected by said pixel;
    BJT circuit coupled to said RSD, said RSD configured to pass said information to said BJT circuit, said BJT circuit configured to drive a value related to said information to a read out device when said row of pixels is accessed;
    a first signal asserted to a pixel access device; and
    a device to cut off said BJT when a second signal is asserted to said device to cut off said BJT wherein the second signal is 180° degrees in opposition of phase in relation to said first signal.

10. The active pixel sensor array of claim 9, said read out circuit wherein the device is adapted to cut off the BJT when said pixel is not accessed.

11. The active pixel sensor array of claim 9, said read out circuit coupled to the read out device, the reset circuit is adapted to reset said read out device prior to access to said pixel.

12. The active pixel sensor array of claim 9, said read out device is a capacitive device.

13. The active pixel sensor array of claim 12, further including:

a reset circuit coupled to the read out device, the reset circuit is adapted to reset the read out circuit which includes a device to discharge said capacitive device and a control circuit to permit said device to discharge said capacitive device prior to access to said pixel.

14. The active pixel sensor array of claim 9, said RSD configured to pass said information to said read out device when the first signal is asserted to said RSD.

15. The active pixel sensor array of claim 9, said second signal derived from said first signal.

16. An imaging system comprising:

a control device;

an active pixel sensor array, coupled to said control device, said active pixel sensor array including an emitter follower circuit (EFC) to receive information indicative of an intensity of light detected by a pixel of an active pixel sensor array and to drive a value related to said information to a read out device when said pixel is accessed;

a post processing device coupled to said control device and to said active pixel sensor array;

a pixel access device coupled to said EFC to pass information from said pixel to said EFC when a first signal asserted to said pixel access device; and a second device to cut off said EFC when a second signal is asserted to the second device, the second signal is 180° degrees in opposition of phase in relation to the first signal.

17. The imaging system of claim 16, further including a pixel access device (PAD) coupled to said pixel and to said control device to pass said information to said EFC when said control device enables said PAD.

18. The imaging system of claim 16, wherein the second device is adapted to cut off the EFC when said pixel is not accessed.

19. The imaging system of claim 16, further including a reset circuit coupled to the read out device, the reset circuit is adapted to reset said read out device prior to access to said pixel.

20. The imaging system of claim 16, said read out device includes a capacitive device.

21. The imaging system of claim 20, said reset circuit includes a device to discharge said capacitive device and a control circuit to permit said device to discharge said capacitive device prior to access to said pixel.

22. The imaging system of claim 16, said second signal derived from said first signal.

23. A read out circuit comprising:

emitter follower circuit (EFC) to receive information indicative of an intensity of light detected by a pixel of an active pixel sensor array and to drive a value related to said information to a read out device when said pixel is accessed;

a pixel access device coupled to said EFC to pass information from said pixel to said EFC when a first signal asserted to said pixel access device; and a device to cut off said EFC when a second signal is asserted to said device, said second signal is 180 degrees in opposition of phase in relation to said first signal.

24. The read out circuit of claim 23, said second signal derived from said first signal.

25. An imaging system comprising:

a control device;

an active pixel sensor array, coupled to said contol device, said active pixel sensor array including an emitter follower circuit (EFC) to receive information indicative of an intensity of light detected by a pixel of an active pixel sensor array and to drive a value related to said information to a read out device when said pixel is accessed;

post processing device coupled to said control device and to said active pixel sensor array;

a pixel access device coupled to said EFC to pass information from said pixel to said EFC when a first signal asserted to said pixel access device; and a device to cut off said EFC when a second signal is asserted to said device to cut off, said second signal 180° degrees in opposition of phase in relation to said first signal.

26. The imaging system of claim 25, said second signal derived from said first signal.

* * * * *

UNITED STATES PATENT AND TRADEMARK OFFICE
CERTIFICATE OF CORRECTION

PATENT NO. : 6,297,492 B1
DATED : October 2, 2001
INVENTOR(S) : Clark

Page 1 of 1

It is certified that error appears in the above-identified patent and that said Letters Patent is hereby corrected as shown below:

<u>Column 2,</u>
Lines 5-6, delete "$(\sqrt{|-2\Phi + scF + V + scSB|} - \sqrt{2|\Phi + scF|})$" and insert
-- $(\sqrt{|-2\Phi_F + V_{SB}|} - \sqrt{2|\Phi_F|})$ --.

Line 10, delete "$|F$" and insert -- $\Phi F$ --.

Signed and Sealed this

Twenty-first Day of May, 2002

Attest:

JAMES E. ROGAN
*Director of the United States Patent and Trademark Office*

*Attesting Officer*